(12) United States Patent
Tseng et al.

(10) Patent No.: US 9,919,350 B2
(45) Date of Patent: Mar. 20, 2018

(54) CUP-WASH DEVICE, SEMICONDUCTOR APPARATUS, AND CUP CLEANING METHOD

(71) Applicant: Taiwan Semiconductor Manufacturing Co., Ltd, Hsin-Chu (TW)

(72) Inventors: Kuo-Shu Tseng, New Taipei (TW); Chih-Hsien Hung, Luodong Township, Yilan County (TW); Cheng-Yi Lin, Taichung (TW); You-Feng Chen, Taichung (TW); Yao-Yuan Shang, Taichung (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 225 days.

(21) Appl. No.: 14/658,888

(22) Filed: Mar. 16, 2015

(65) Prior Publication Data

US 2016/0276207 A1  Sep. 22, 2016

(51) Int. Cl.
*B08B 9/00* (2006.01)
*H01L 21/67* (2006.01)
*B08B 9/08* (2006.01)

(52) U.S. Cl.
CPC .......... *B08B 9/00* (2013.01); *H01L 21/67051* (2013.01); *B08B 9/0813* (2013.01); *B08B 2203/0264* (2013.01)

(58) Field of Classification Search
None
See application file for complete search history.

(56) References Cited

U.S. PATENT DOCUMENTS

| 5,312,487 A * | 5/1994 | Akimoto | H01L 21/6715 118/302 |
| 5,677,000 A * | 10/1997 | Yoshioka | H01L 21/6715 118/52 |
| 5,947,136 A * | 9/1999 | Abras | B05C 11/08 134/104.1 |
| 2014/0017615 A1 | 1/2014 | Chang | |

* cited by examiner

*Primary Examiner* — Mikhail Kornakov
*Assistant Examiner* — Ryan L. Coleman
(74) *Attorney, Agent, or Firm* — McClure, Qualey & Rodack, LLP

(57) ABSTRACT

A cup-wash device is provided. The cup-wash device includes a supporting disk and a base disposed on the supporting disk. The base includes a catchment groove, a first dispensing opening formed on an edge of the base, and a first channel connected with the catchment groove and the first dispensing opening. The cup-wash device also includes a cover disposed on the base and covering the first channel, and the cover has an injection opening connected to the catchment groove.

18 Claims, 13 Drawing Sheets

CUP-WASH DEVICE, SEMICONDUCTOR APPARATUS, AND CUP CLEANING METHOD

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a wafer, and patterning the various material layers using lithography to form circuit components and elements thereon. Many integrated circuits are typically manufactured on a single wafer, and individual dies on the wafer are singulated by sawing between the integrated circuits along a scribe line. The individual dies are typically packaged separately, in multi-chip modules, or in other types of packaging, for example.

In the lithography process, a photoresist is applied to a wafer. A thin layer of the photoresist is spread on the surface of the wafer, and the photoresist is exposed and developed to form a pattern in the semiconductor manufacturing process. These developed patterns now have very fine details, and some issues may cause unsatisfactory defects in the developed photoresist.

Although existing devices for lithography processing have been generally adequate for their intended purposes, they have not been entirely satisfactory in all respects. Consequently, it would be desirable to provide a solution for improving the quality of the developed photoresist.

BRIEF DESCRIPTION OF THE DRAWINGS

Aspects of the present disclosure are best understood from the following detailed description when read with the accompanying figures. It is noted that, in accordance with standard practice in the industry, various features are not drawn to scale. In fact, the dimensions of the various features may be arbitrarily increased or reduced for clarity of discussion.

DETAILED DESCRIPTION

Figure 1:
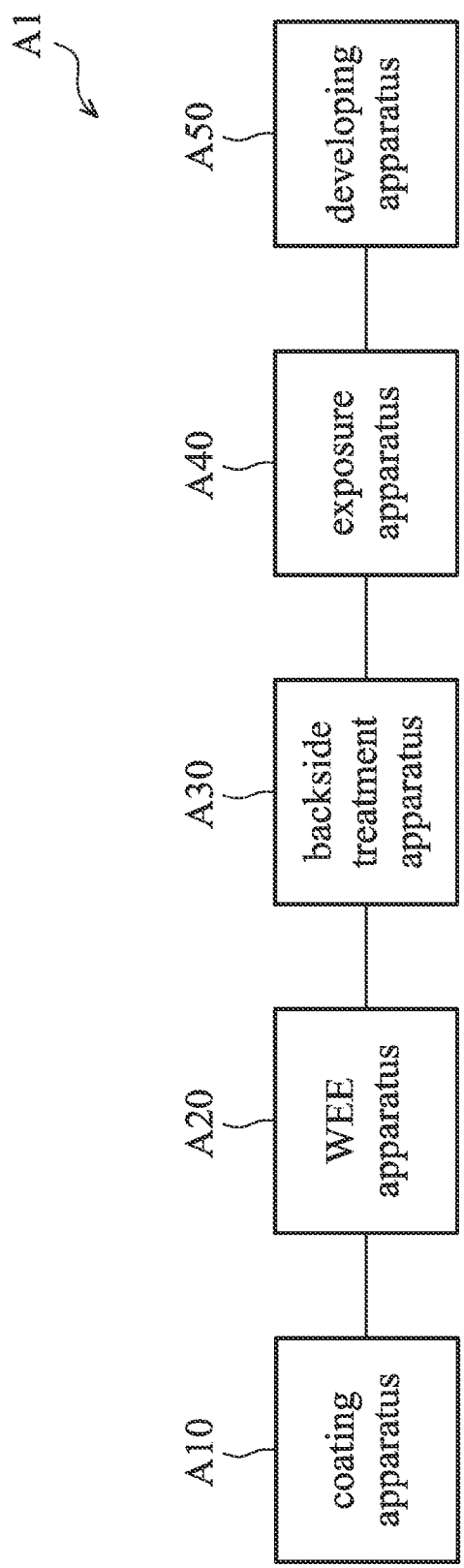
FIG. 1 is a schematic view of a semiconductor apparatus in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

A cup-wash device and a cup cleaning method for a semiconductor apparatus are provided. The cup-wash device is configured to be disposed on a wafer chuck, and wash the cup without detaching the cup from the semiconductor apparatus.

The semiconductor apparatus is configured to perform semiconductor manufacturing processes on a wafer. In some embodiments, the semiconductor apparatus is a chemical mechanical polishing (CMP) apparatus, a physical vapor deposition (PVD) apparatus, a chemical vapor deposition (CVD) apparatus, an ion implant apparatus, an epitaxy apparatus, a sputter apparatus, a thermal processing apparatus, an etching apparatus, a lithography apparatus, or another suitable apparatus.

In some embodiments, the semiconductor manufacturing process includes a CMP process, a PVD process, a CVD process, an ALD process, a doping process, a screen printing process, a dry etching process, a wet etching process, a photolithography process, or another suitable processes.

FIG. 1 is a schematic view of a semiconductor apparatus A1 in accordance with some embodiments of the disclosure. In some embodiments, the semiconductor apparatus A1 is a lithography apparatus. The lithography apparatus A1 includes a number of apparatuses, such as a coating apparatus A10, a WEE (wafer-edge exposure) apparatus A20, a backside treatment apparatus A30, an exposure apparatus A40, and a developing apparatus A50.

The coating apparatus A10 is configured to coat a photoresist on a wafer by a coating process. The wafer is transmitted to the WEE apparatus A20 after the coating process.

The WEE apparatus A20 is configured to remove the photoresist at the edge of the wafer by a WEE process. Afterward, the wafer is transmitted to the backside treatment apparatus A30 after the WEE process. The backside treatment apparatus A30 is configured to clean the backside of the wafer by a backside cleaning process.

The wafer is transmitted to the exposure apparatus A40 after the backside cleaning process. The exposure apparatus A40 is configured to form a pattern on the photoresist by an exposure process. Finally, the wafer is transmitted to the developing apparatus A50 after the exposure process. The developing apparatus A50 is configured to develop a resist pattern to the exposed photoresist by a developing process. Afterwards, the wafer is transmitted to another semiconductor apparatus, such as an etching apparatus or a chemical vapor deposition (CVD) apparatus.

Figure 2A:
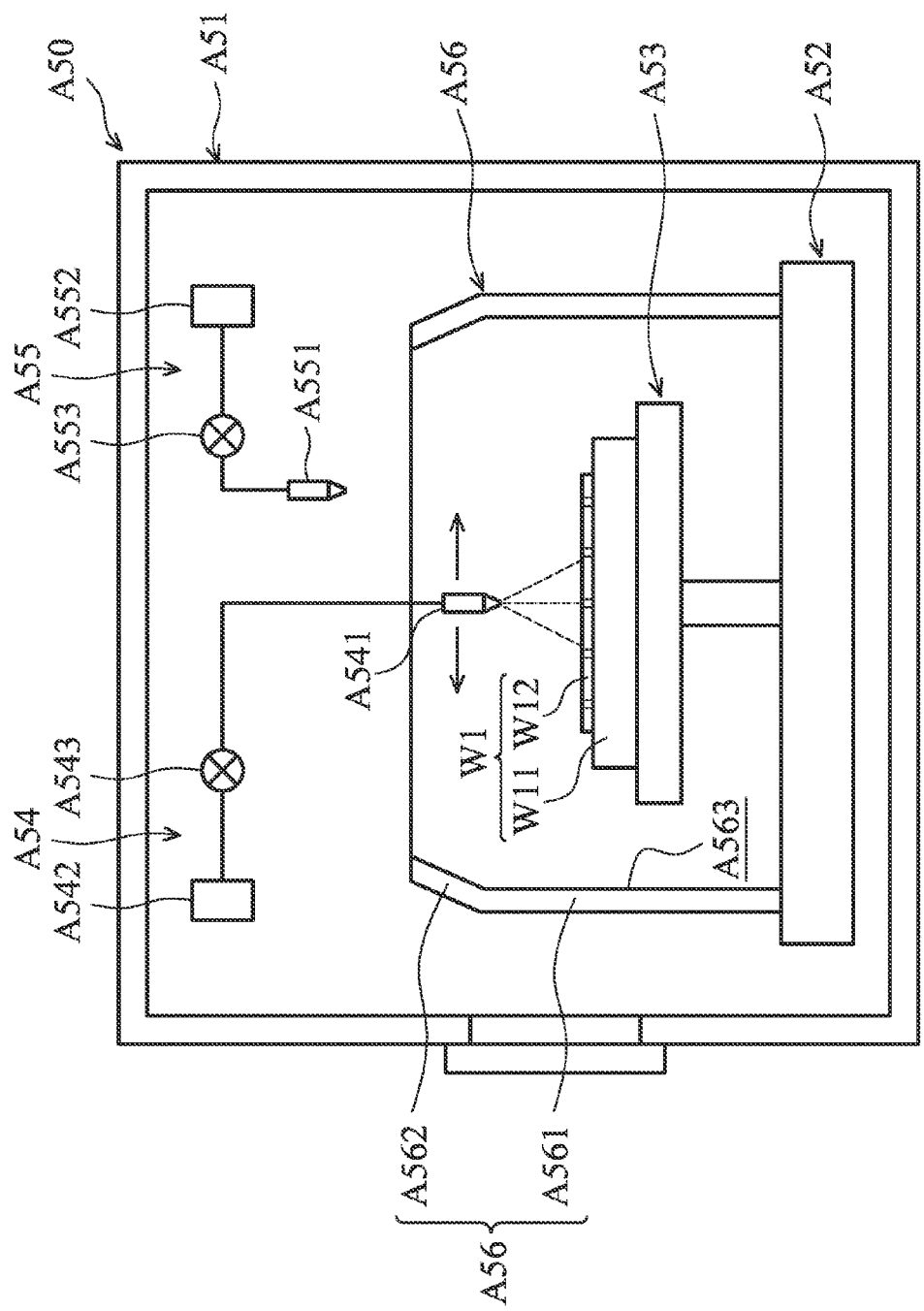
FIGS. 2A, 2B, and 2C are schematic views of a developing apparatus in accordance with some embodiments of the disclosure.
Figure 2B:
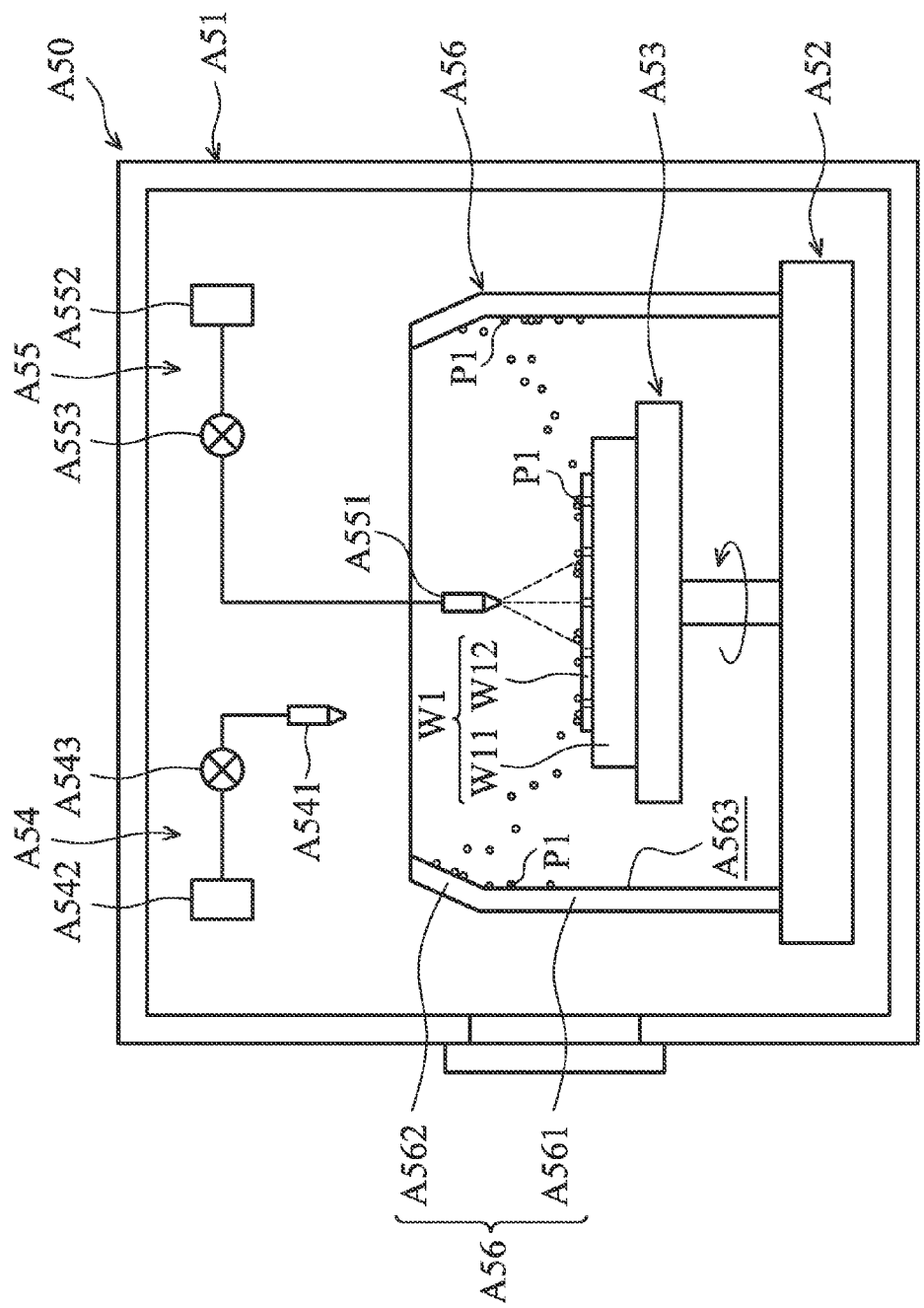
Figure 2C:
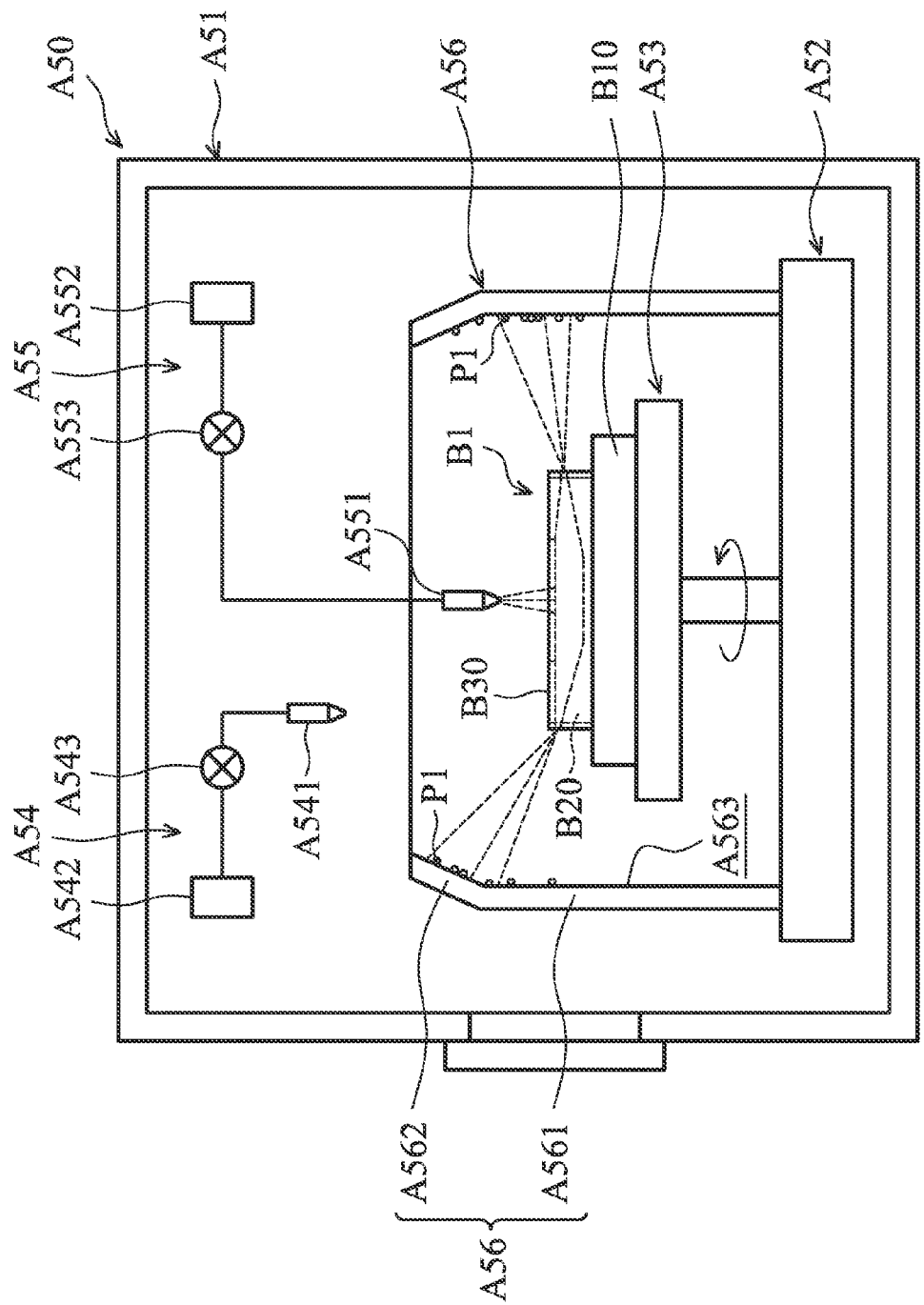

FIGS. 2A, 2B, and 2C are schematic views of the developing apparatus A50 in accordance with some embodiments of the disclosure. The developing apparatus A50 includes a processing chamber A51, a stage A52, a wafer chuck A53, a developing supply device A54, a cleaning supply device A55 and a cup A56. The stage A52 is disposed in the processing chamber A51.

The wafer chuck A53 is disposed on the stage A52. The wafer chuck A53 is configured to hold and to rotate a wafer W1. In some embodiments, the wafer chuck A53 is an electrostatic wafer chuck. In some embodiments, the wafer W1 includes a substrate W11 and a photoresist W12. The photoresist W12 is performed by an exposure process.

The developing supply device A54 includes a nozzle A541, a tank A542 and a pump A543. The nozzle A541 is configured to dispense a developing liquid to the wafer W1. The tank A542 is configured to contain the developing liquid. The pump A543 is configured to apply the developing liquid in the tank A542 to the nozzle A541.

In some embodiments, the developing supply device includes a number of tanks A542 containing different kinds of developing liquids. The nozzle A541 is configured to dispense a mixture liquid of developing liquids from the tanks A542.

The cleaning supply device A55 includes a nozzle A551, a tank A552 and a pump A553. The nozzle A551 is configured to dispense a washing liquid to the wafer W1. In some embodiments, the washing liquid is water, deionized water (DI water) or other chemical which can clean effectively. The tank A552 is configured to contain the washing liquid. The pump A553 is configured to apply the washing liquid in the tank A552 to the nozzle A551.

The cup A56 is a hollow columnar structure. The wafer chuck A53 and the wafer W1 are located in the cup A56. The cup A56 includes a surrounding wall A561 and a cover wall A562. The surrounding wall A561 and the cover wall A562 are hollow columnar structures.

The surrounding wall A561 is around the wafer chuck A53 and the wafer W1. In some embodiments, the surrounding wall A561 is substantially perpendicular to the stage A52. In some embodiments, the distance between the surrounding wall A561 and the wafer chuck A53 (or the wafer disposed on the wafer chuck A53) is in a range from about 80 mm to 150 mm.

The cover wall A562 is connected to the top of the surrounding wall A561, and inclined to the surrounding wall A561. In other words, the cover wall A562 is gradually narrowed from the bottom of the cover wall A562 to the top of the cover wall A562. In some embodiments, the height of the cover wall A562 relative to the stage A52 is about 1 times to about 2 times height of the wafer chuck A53 relative to the stage A52.

When the developing apparatus A50 processes a developing process, the wafer W1 is held on the wafer chuck A53.

As shown in FIG. 2A, the nozzle A541 dispenses the developing liquid on the photoresist W12 of the wafer W1.

In some embodiments, the photoresist W12 is a positive tone photoresist or a negative tone photoresist. The final resist pattern depends on the developer tone. For example, when the developing liquid is a positive tone developing (PTD) liquid, the exposed (hydrophilic) portions of the photoresist W12 are dissolved by the developing liquid during the developing process. The unexposed (hydrophobic) portions of the photoresist W12 remain to form a resist pattern.

In some embodiments, when the developing liquid is a negative tone developing (NTD) liquid, the unexposed (hydrophobic) portions of the photoresist W12 are dissolved by the developing liquid. The exposed (hydrophilic) portions of the photoresist W12 remain after the developing process to form a resist pattern.

After the developing liquid reacts with the photoresist, the portions of photoresist W12 dissolved by the developing liquid act as contaminants P1 to the developed wafer W1.

As shown in FIG. 2B, the nozzle A551 is moved to a location over the center of the wafer W1, and dispenses the washing liquid on the wafer. Moreover, the wafer chuck A53 rotates the wafer W1 to make the washing liquid flow, thus washing the top surface of the wafer W1, and to remove the contaminants P1 on the wafer W1.

However, because of the rotation of the wafer W1, the washing liquid with the contaminants P1 is also sprayed from the edge of the wafer W1 to the inner surface A563 of the cup A56. Therefore, some of the contaminants P1 adhere to the inner surface A563 of the surrounding wall A561 and the cover wall A562 of the cup A56.

The contaminants P1 may fall from the inner surface A563 of the cup A56 on a subsequent wafer. The contaminants P1 adhering to the cover wall A562 and the surrounding wall A561 higher than the wafer W1 have an especially greater chance to fall on the wafer W1.

As shown in FIG. 2C, the cup-wash device B1 is configured to clean the contaminants P1 adhering to the inner surface A563 of the surrounding wall A561 and the cover wall A562 of the cup A56. When a cup cleaning process is processed, the cup-wash device B1 is disposed on the wafer chuck A53 and is located in the cup A56. The nozzle A551 dispenses the washing liquid into the cup-wash device B1, and afterward, the wafer chuck A53 rotates the cup-wash device B1.

The washing liquid in the cup-wash device B1 is sprayed to the inner surface A563 of the cup A56 by the centrifugal force of the rotation of the cup-wash device B1. Therefore, the washing liquid sprayed by the cup-wash device B1 washes the inner surface A563 of the cup A56.

Figure 3:
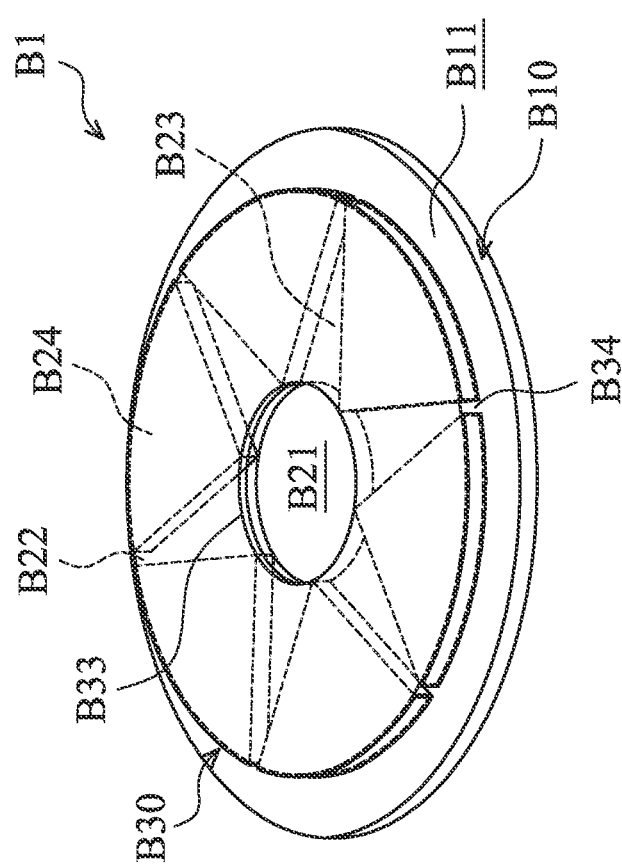
FIG. 3 is a perspective view of a cup-wash device in accordance with some embodiments of the disclosure.
Figure 4:
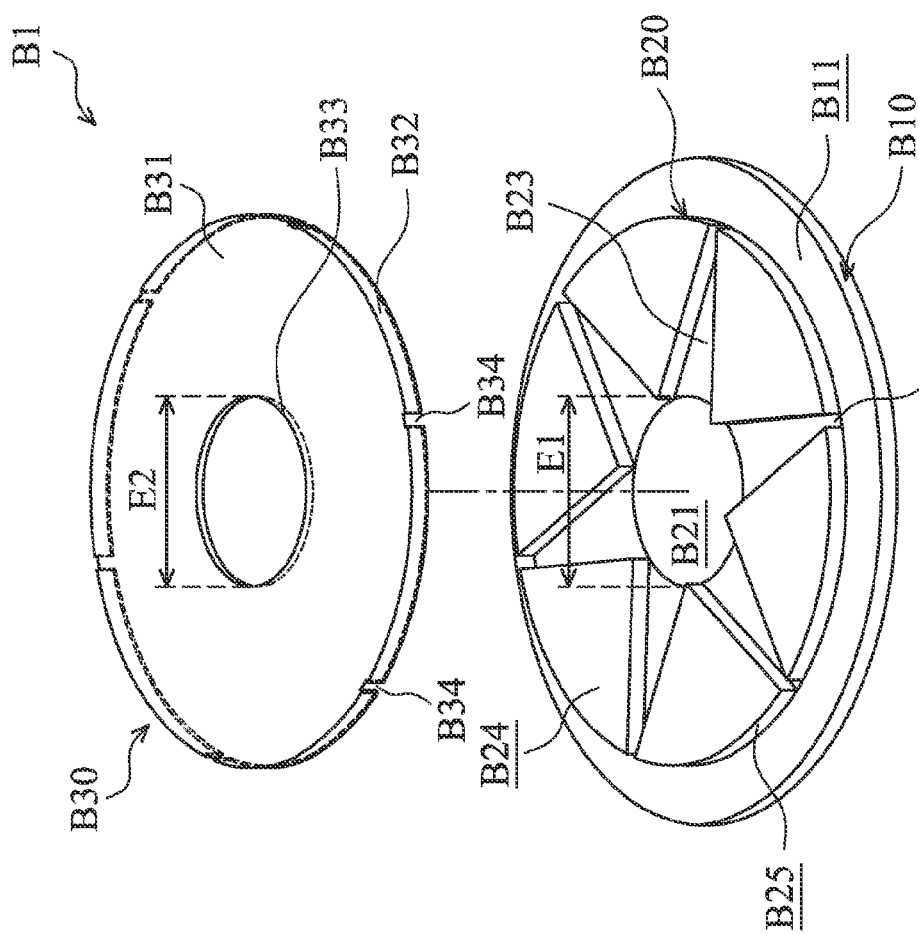
FIG. 4 is an exploded view of the cup-wash device in accordance with some embodiments of the disclosure.
Figure 5:
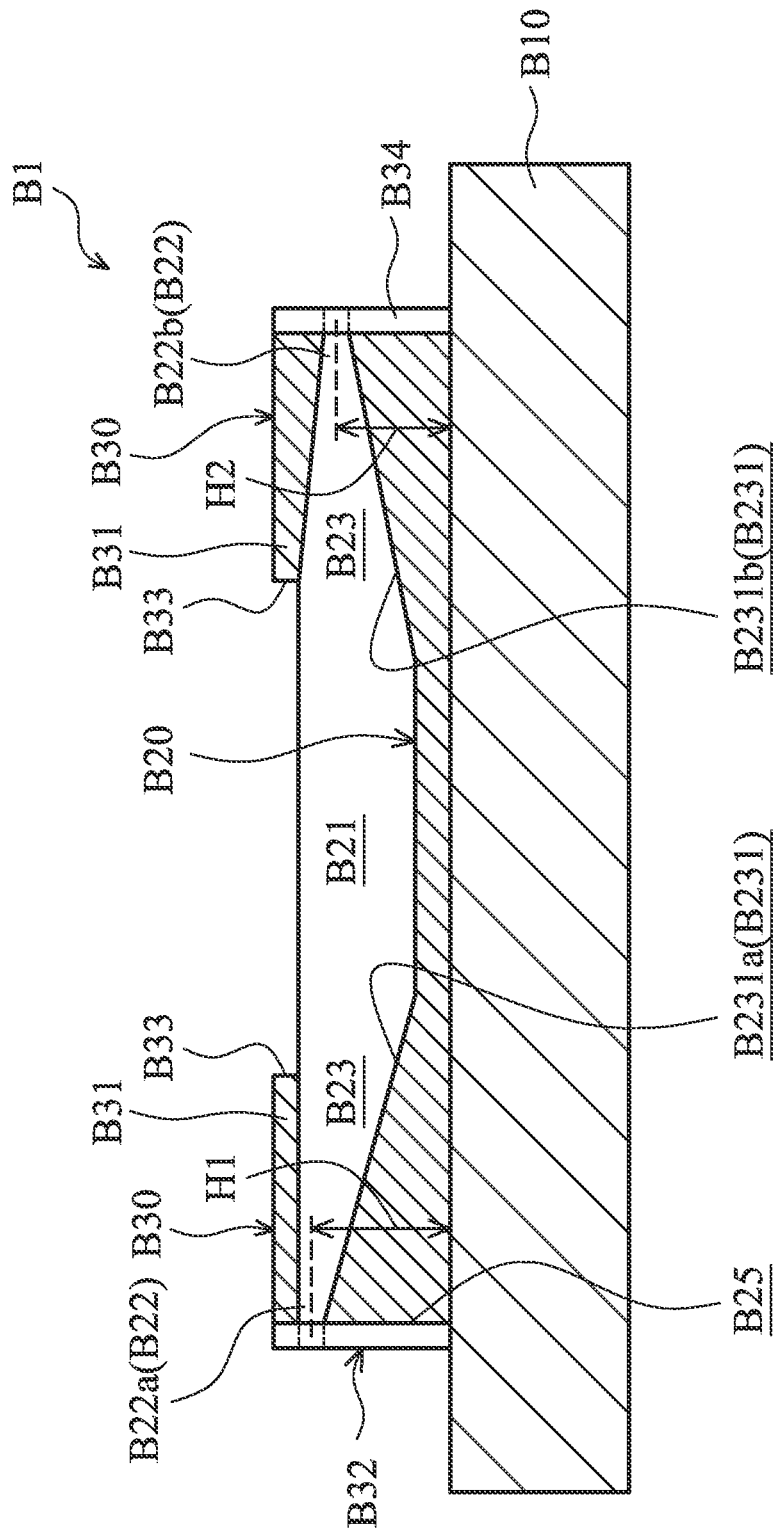
FIG. 5 is a cross-sectional view of the cup-wash device in accordance with some embodiments of the disclosure.

FIG. 3 is a perspective view of the cup-wash device B1 in accordance with some embodiments of the disclosure. FIG. 4 is an exploded view of the cup-wash device B1 in accordance with some embodiments of the disclosure. FIG. 5 is a cross-sectional view of the cup-wash device B1 in accordance with some embodiments of the disclosure. In some embodiments, the cup-wash device B1 is a disk structure. The rotation speed of the cup-wash device B1 rotated by the wafer chuck A53 in a range from about 30 rpm to about 3000 rpm.

The cup-wash device B1 includes a supporting disk B10, a base B20, and a cover B30. In some embodiments, the supporting disk B10 is a circle-shaped structure. In some embodiments, the supporting disk B10 is a wafer W1. The supporting disk B10 includes silicon. In some embodiments, the diameter of the supporting disk B10 is in a range from about 200 mm to about 600 mm. In some embodiments, the thickness of the supporting disk B10 is in a range from about 300 um to about 3000 um.

The base B20 is disposed on the supporting disk B10. In some embodiments, the bottom surface of the base B20 is adhered or fixed on the top surface B11 of the supporting disk B10. The base B20 is substantially parallel to the supporting disk B10. In some embodiments, the base B20 includes polytetrafluoroethene (PTFE).

In some embodiments, the base B20 is a disk structure. In some embodiments, the base B20 is a circle-shaped structure. In some embodiments, the diameter of the supporting disk B10 is equal to or greater than the diameter of the base B20. In some embodiments, the diameter of the supporting disk B10 is about 1 times to about 7.5 times the diameter of the base B20. In some embodiments, the diameter of the base B20 is in a range from about 100 mm to about 600 mm. In some embodiments, the thickness of the base B20 is in a range from about 2 mm to about 16 mm.

The base B20 includes a catchment groove B21, a number of dispensing openings B22, and a number of channels B23. The catchment groove B21, the dispensing openings B22, and the channels B23 are formed on the top surface B24 of the base B20. The catchment groove B21 is located at the central area of the base B20. In some embodiments, the catchment groove B21 has a circular shape. The catchment groove B21 is configured to receive the washing liquid.

In some embodiments, the width E1 of the catchment groove B21 is in a range from about 40 mm to about 570 mm. The depth of the catchment groove B21 is in a range from about 1 mm to about 15 mm. In some embodiments, the width E1 of the catchment groove B21 is about 5 times to about 120 times the depth of the catchment groove B21. The diameter of the base B20 is about 1.1 times to about 10 times the width E1 catchment groove B21.

The dispensing openings B22 are formed on the edge of the base B20. The dispensing openings B22 are configured to spray the washing liquid in the cup-wash device B1 to the cup A56 when the cup-wash device B1 is rotated. In some embodiments, the dispensing openings B22 are formed on the side surface B25 of the base B20. In some embodiments, the dispensing openings B22 are arranged annularly on the side surface B25. In some embodiments, the intervals of the dispensing openings B22 are the same. In some embodiments, the width of the dispensing opening B22 is in a range from about 500 um to about 2000 um.

The heights of the dispensing openings B22 relative to the supporting disk B10 (or the top surface of the wafer chuck A53) are gradually increased. As shown in FIG. 5, the height H1 of the dispensing opening B22a relative to the supporting disk B10 is higher than the height H2 of the dispensing opening B22b relative to the supporting disk B10. In some embodiments, the height H1 is in a range from about 1 mm to 15 mm. The height H2 is in a range from about 0.5 mm to 13 mm.

Each of the channels B23 is connected with the catchment groove B21 and one of the dispensing openings B22. The channel B23 is gradually narrowed from the catchment groove B21 to the dispensing opening B22. The channels B23 are radially arranged about the catchment groove B21. In some embodiments, the channels B23 are symmetrically arranged about the catchment groove B21. In other words, the catchment groove B21 is located between two opposite channels B23.

The inclinations of the bottom surfaces B231 of the channels B23 relative to the supporting disk B10 are gradually increased. In some embodiments, the inclination angle of the bottom surfaces B231 of the channels B23 relative to the supporting disk B10 in a range from about 0 degrees to 5 degrees. As shown in FIG. 5, the inclination of the bottom surface B231a of the channel B23 relative to the supporting disk B10 is greater than the inclination of the bottom surface B231b of the channel B23 relative to the supporting disk B10.

Figure 6B:
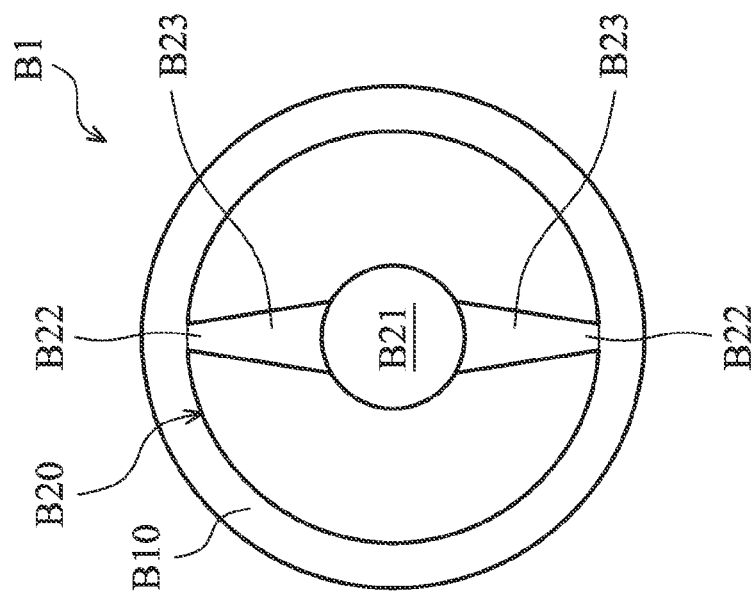
FIGS. 6A to 6D are top views of cup-wash devices in accordance with some embodiments of the disclosure.
Figure 6A:
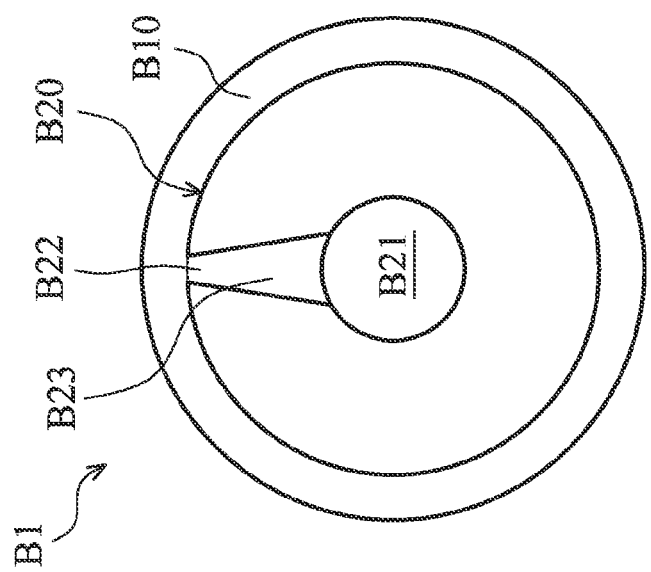

FIGS. 6A to 6D are top views of cup-wash devices B1 in accordance with some embodiments of the disclosure, and the cover B30 is not illustrated in FIGS. 6A to 6D. As shown in FIG. 6A, the cup-wash device B1 includes one dispensing opening B22 and one channel B23. Therefore, the pressure of the washing liquid sprayed on the cup A56 by the cup-wash device B1 is increased compared to the cup-wash device B1 in FIG. 3.

As shown in FIG. 6B, the cup-wash device B1 includes two dispensing openings B22 and two channels B23. The channels B23 are respectively located at two opposite sides of the catchment groove B21. In some embodiments, the catchment groove B21, the dispensing openings B22, and the channels B23 are arranged along an axis. Therefore, the dynamic balance of the cup-wash device B1 is improved, and the pressure of the washing liquid sprayed on the cup A56 by the cup-wash device B1 is increased compared to the cup-wash device B1 in FIG. 3.

Figure 6D:
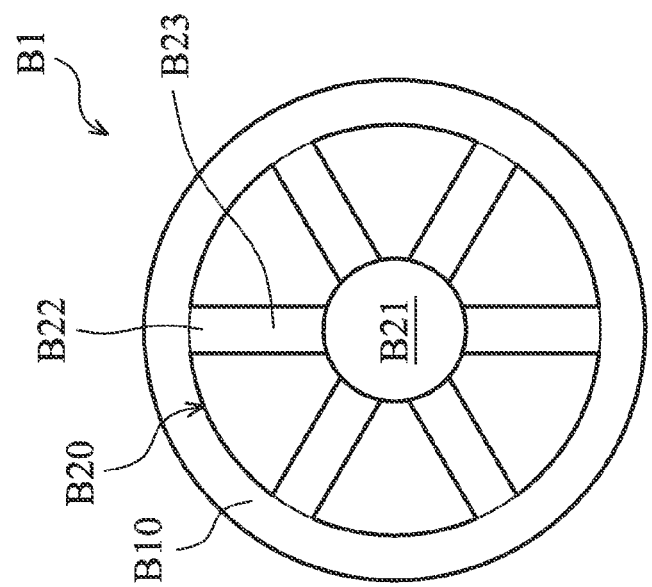
Figure 6C:
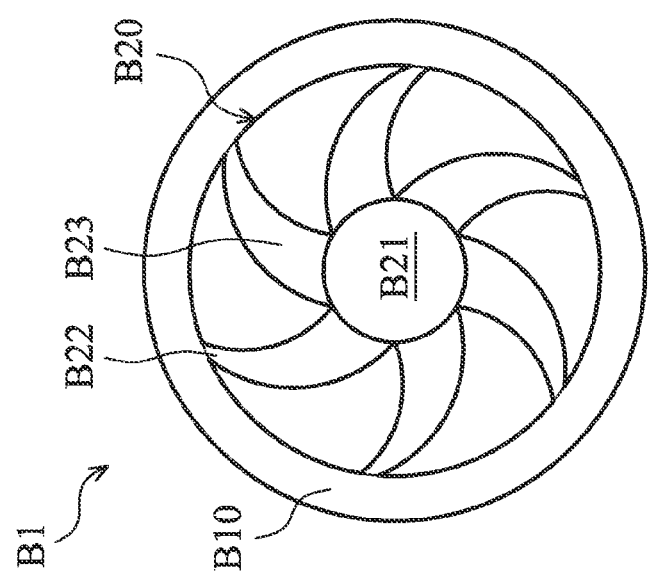

As shown in FIG. 6C, the channels B23 form a spiral shape. In other words, each of the channels B23 extends along a curved path. Therefore, the washing liquid flows smoothly in the channels B23 when the cup-wash device B1 is rotated.

As shown in FIG. 6D, each of the channels B23 has a rectangular shape. In other words, the channel B23 extends linearly. Since the areas of the dispensing openings B22 are great, the quantity of the washing liquid sprayed to the cup A56 is increased compared to the cup-wash device B1 in FIG. 3.

As shown in FIGS. 3 to 5, the cover B30 is disposed on the base B20, and connected to the top surface B24 of the base B20. The cover B30 covers the catchment groove B21, the dispensing openings B22, and the channels B23. In some embodiments, the cover B30 is a disk structure. In some embodiments, the cover B30 is a circle-shaped structure. In some embodiments, the base B20 and the cover B30 are formed as a single piece. In some embodiments, the cover B30 includes polytetrafluoroethene (PTFE).

In some embodiments, the cover B30 includes a cover body B31 and a side wall B32. In some embodiments, the cover body B31 is a disk structure. In some embodiments, the cover body B31 is a circle-shaped structure. In some embodiments, the diameter of the cover B30 is substantially equal to the diameter of the base B20.

The cover body B31 has an injection opening B33 connected to the catchment groove B21. In some embodiments, the width E1 of the catchment groove B21 is substantially equal to the width E2 of the cover body B31. In some embodiments, the width E1 of the catchment groove B21 is about 1 times to about 3 times the width E2 of the injection opening B33 as shown in FIG. 4.

The side wall B32 is disposed on the edge of the cover body B31 and connected to the side surface B25 of the base B20. In some embodiments, the side wall B32 is sustainably perpendicular to the cover body B31. In some embodiments, the height of the side wall B32 relative to the cover body B31 is substantially equal to the thickness of the base B20.

The side wall B32 includes a number of through holes B34 respectively corresponding to the dispensing openings B22. The through holes B34 are arranged annularly on the side wall B32. In some embodiments, the intervals of the through holes B34 are the same. In some embodiments, the area of the through hole B34 is greater than or equal to the area of the dispensing opening B22.

In some embodiments, the side wall B32 is not omitted from the cover B30. The cover body B31 is fixed on or adheres to the top surface B24 of the base B20.

Figure 7:
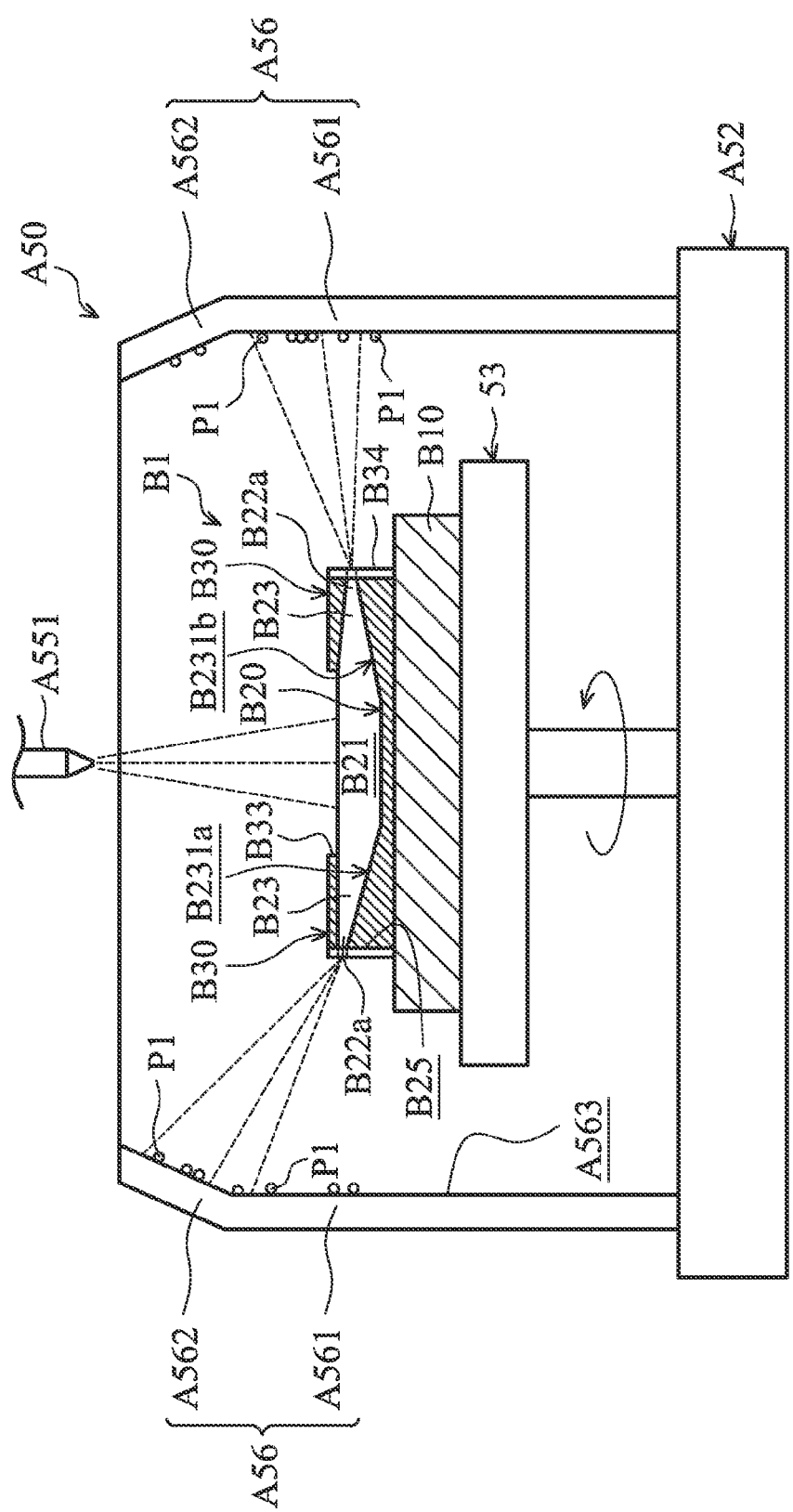
FIG. 7 is a schematic view of the developing apparatus in accordance with some embodiments of the disclosure.

FIG. 7 is a schematic view of the developing apparatus A50 in accordance with some embodiments of the disclosure. A cup cleaning process is processed by the developing apparatus A50. The nozzle A551 dispenses the washing liquid into the catchment groove B21 via the injection opening B33. The wafer chuck A53 rotates the cup-wash device B1, and the cup-wash device B1 generates a centrifugal force. Therefore, the washing liquid in the catchment groove B21 flows to the dispensing openings B22 via the channels B23, and sprays onto the cup A56 via the dispensing openings B22 by the centrifugal force.

As shown in FIGS. 5 and 7, the inclination of the bottom surface B231a is greater than the inclination of the bottom surface B231b, and the height H1 of the dispensing opening B22a is higher than the height H2 of the dispensing opening B22b. As shown in FIG. 7, the dispensing opening B22a sprays the washing liquid on the cover wall A562, and the dispensing opening B22b sprays the washing liquid on the surrounding wall A561 close to the cover wall A562. Accordingly, an area of the washing liquid sprayed on the cup A56 via the dispensing opening B22a is higher than an area of the washing liquid sprayed on the cup A56 via the dispensing opening B22b.

Because the cup-wash device B1 is rotated by the wafer chuck A53, the areas of the washing liquid sprayed on the cup A56 via the dispensing opening B22 are along circular paths on the inner surface A563. Therefore, the inner surface A563 of the cup A56 higher than the wafer chuck A53 (or the wafer W1 as shown in FIG. 2A disposed on the wafer chuck A53) can be sprayed by the washing liquid since the cup-wash device B1 is rotated. The contaminants P1 adhering to the inner surface A563 can be washed and removed with the washing liquid. Moreover, the cup A56 is not washed manually, and the maintenance time of the semiconductor apparatus is decreased.

In some embodiments, the cup-wash device B1 can be applied to different semiconductor apparatuses with a cup around a wafer chuck, such as the coating apparatus A10, the backside treatment apparatus A30, an etching apparatus, or a CMP apparatus.

Figure 8:
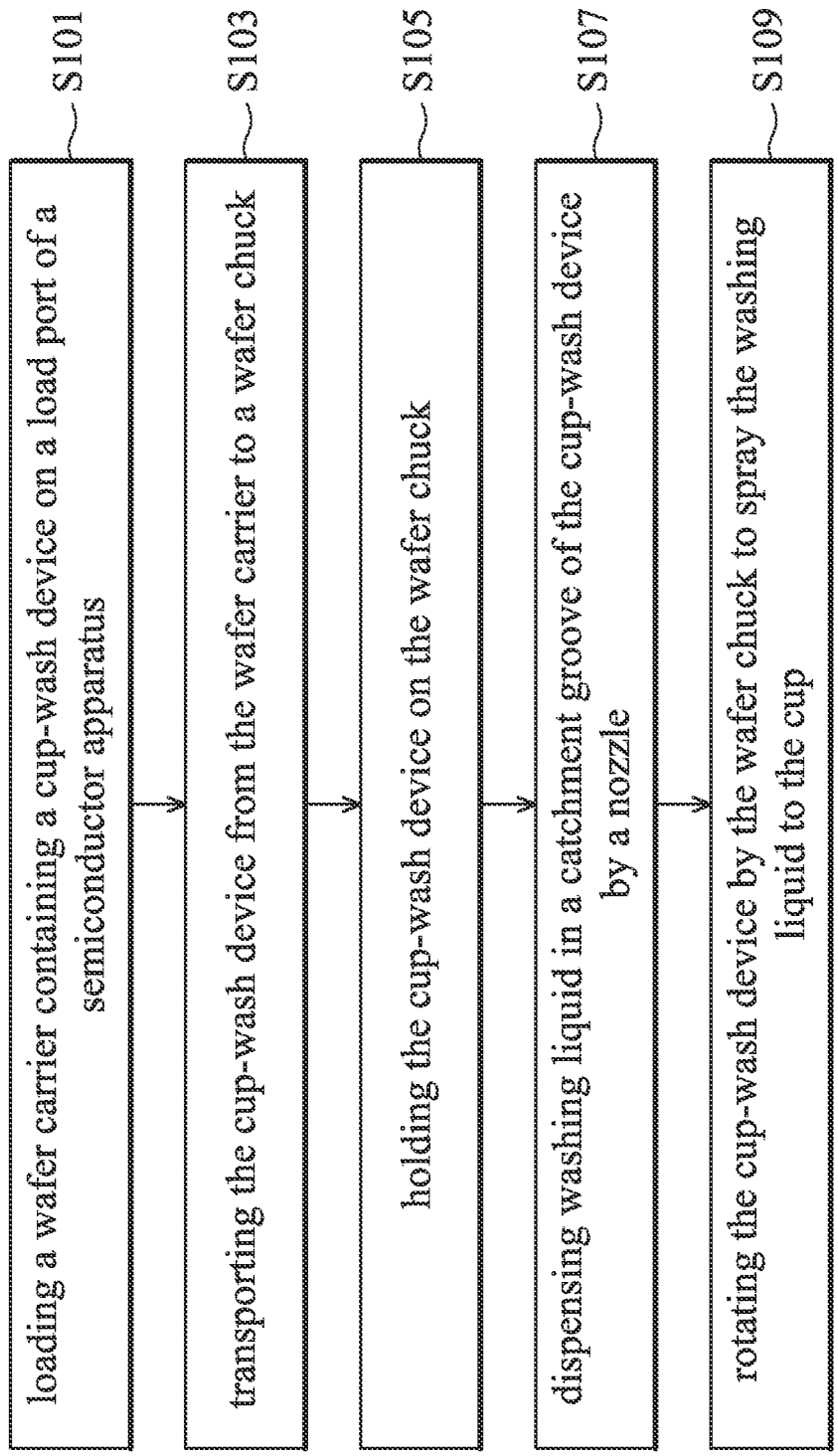
FIG. 8 is a flow chart of a cup cleaning method for the semiconductor apparatus in accordance with some embodiments of the disclosure.
Figure 9A:
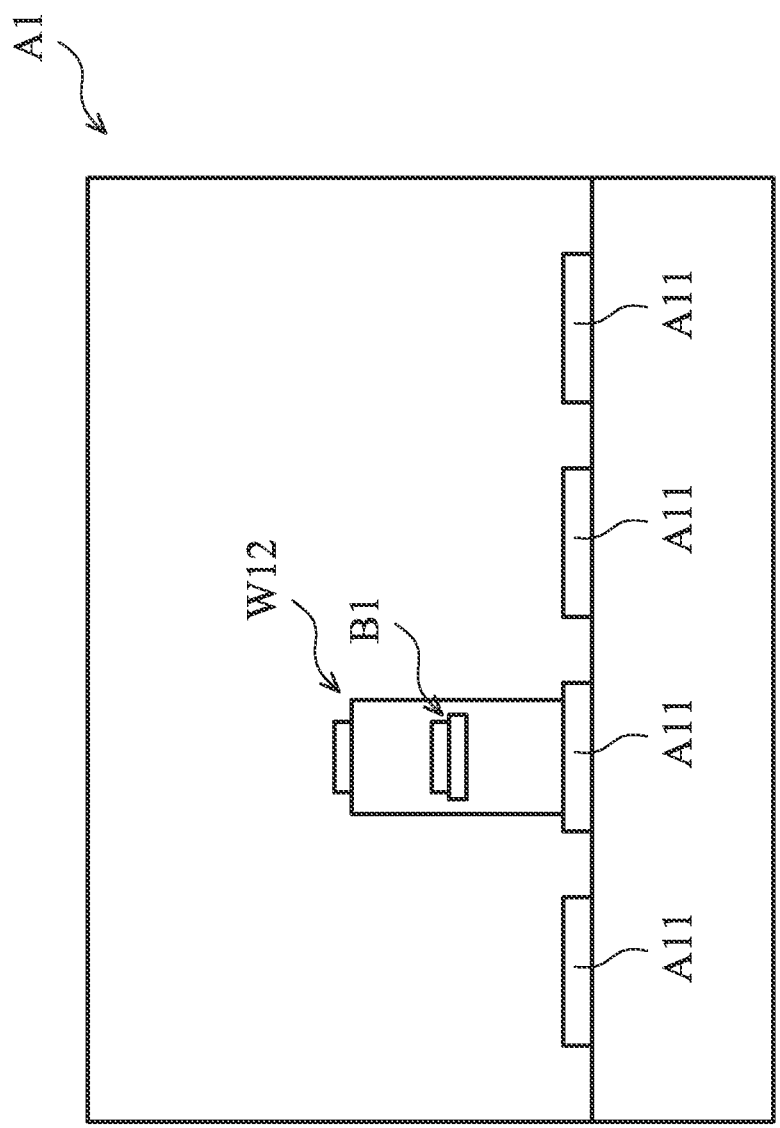
FIGS. 9A to 9B are schematic views of the cup cleaning method for the semiconductor apparatus during an intermediate stage in accordance with some embodiments of the disclosure.
Figure 9B:
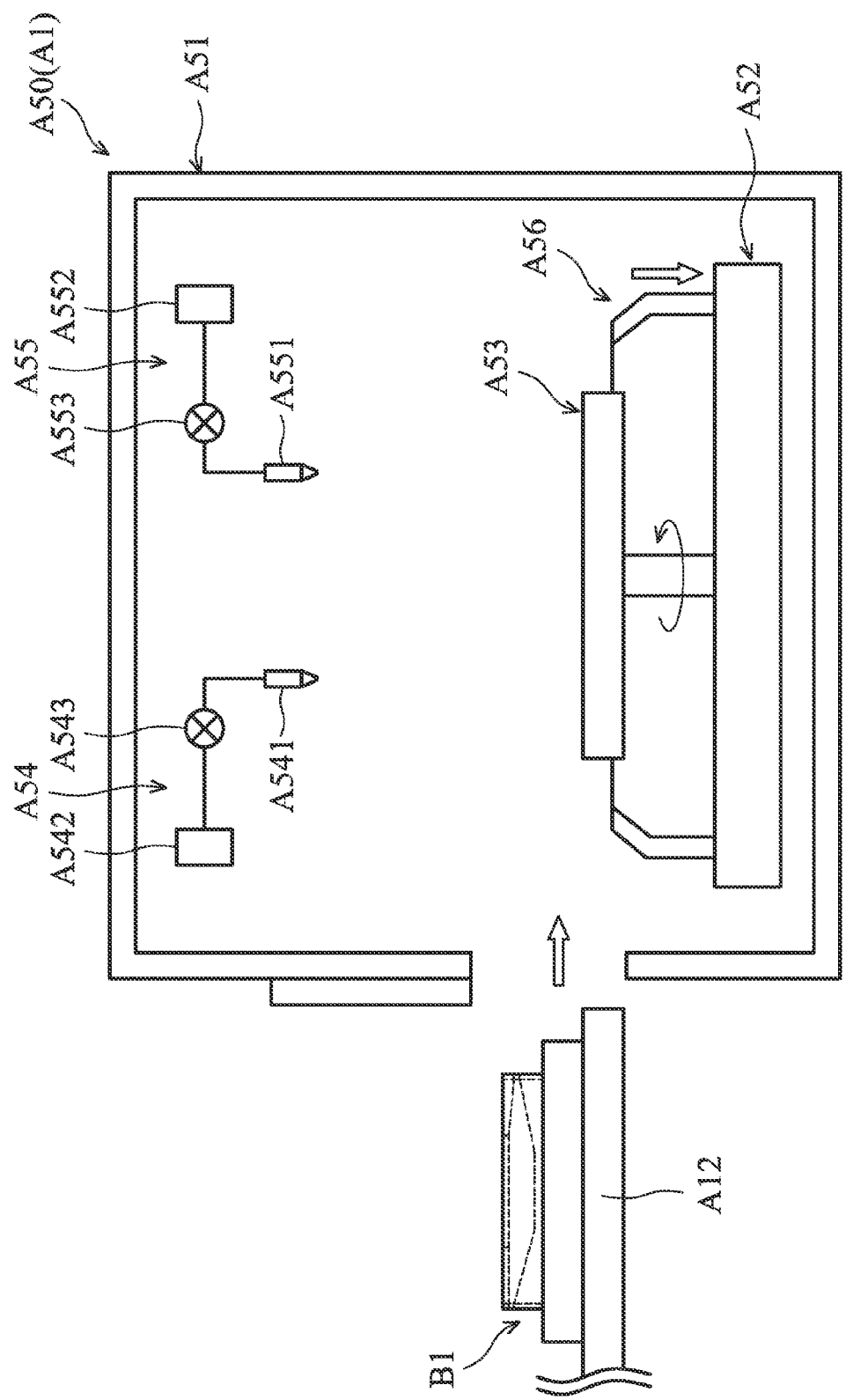

FIG. 8 is a flow chart of a cup cleaning method for the semiconductor apparatus A1 in accordance with some embodiments of the disclosure. FIGS. 9A to 9B are schematic views of the cup cleaning method for the semiconductor apparatus A1 during an intermediate stage in accordance with some embodiments of the disclosure. By the cup cleaning method, the cup A56 of the semiconductor apparatus A1 can be washed automatically.

In step S101, the semiconductor apparatus A1 includes a number of load ports A11. A wafer carrier W2 is loaded on one of the load ports 11. In some embodiments, the wafer carrier W2 is a wafer pod, a front opening unified pod (FOUP), a wafer lot, a wafer cassette, or a wafer boat.

The wafer carrier W2 is configured to contain wafers W1. Since the supporting disk B10 is the same size as the wafer W1 (or the supporting disk B10 is a wafer W1), the cup-wash device B1 can be contained in the wafer carrier W2. As shown in FIG. 9A, the wafer carrier W2 loaded on the load port A11 contains the cup-wash device B1.

In step S103, a wafer arm A12 of the semiconductor apparatus A1 takes the cup-wash device B1 from the cup-wash device B1, and transports the cup-wash device B1 to the wafer chuck A53 as shown in FIG. 9B. When the wafer arm A12 moves into the processing chamber A51, the cup A56 is moved downwardly to the stage A52.

When the top of the cup A56 is lower than the top surface of the wafer chuck A53, the wafer arm A12 puts the cup-wash device B1 on the top surface of the wafer chuck A53. After the wafer arm A12 leaves the processing chamber A51, the cup A56 is raised to over the top surface of the cup-wash device B1 as shown in FIG. 2C.

In step S105, the wafer chuck A53 is enabled, and the cup-wash device B1 is held by the wafer chuck A53. In step S107, as shown in FIGS. 2C and 7, the nozzle A551 dispenses a washing liquid in the catchment groove B21 of the cup-wash device B1. In step S109, the wafer chuck A53 rotates the cup-wash device B1 to spray the washing liquid to the cup A56, and the washing liquid is sprayed on the inner surface A563 of the cup A56 to wash the contaminants P1 on the cup A56 as shown in FIGS. 2C and 6.

Using the cup cleaning method, the cup A56 does not need to be washed manually, and the semiconductor apparatus A1 does not need to be shut down to wait for the cup A56 to be washed. Accordingly, the cup cleaning process can be executed automatically by the semiconductor apparatus.

Embodiments of a cup-wash device B1 and a cup cleaning method for a semiconductor apparatus A1 are provided. The cup-wash device B1 is configured to be disposed on a wafer chuck A53, and a cup A56 in the semiconductor apparatus A1 is washed by the cup-wash device B1 without detaching the cup A56 from the semiconductor apparatus A1. Moreover, the cup-wash device B1 can be stored in a wafer carrier W2, and transported to the wafer chuck A53 by a wafer arm A12 of the semiconductor apparatus. Therefore, a cup cleaning process can be executed automatically by the semiconductor apparatus A1.

In some embodiments, a cup-wash device is provided. The cup-wash device includes a supporting disk and a base disposed on the supporting disk. The base includes a catchment groove, a first dispensing opening formed on an edge of the base, and a first channel connected with the catchment groove and the first dispensing opening. The cup-wash device also includes a cover disposed on the base and covering the first channel, and the cover has an injection opening connected to the catchment groove.

In some embodiments, a semiconductor apparatus is provided. The semiconductor apparatus includes a cup, a wafer chuck located in the cup, and a cup-wash device disposed on the wafer chuck and located in the cup. The cup-wash device includes a supporting disk, a base disposed on the supporting disk. The base includes a catchment groove, a number of dispensing openings on an edge of the base and facing the cup, and a number of channels connected with the catchment groove and the dispensing openings. The cup-wash device also includes a cover disposed on the base and covering the channels, and the cover has an injection opening connected to the catchment groove. The channels are radially arranged about the catchment groove at the base.

In some embodiments, a cup cleaning method for a semiconductor apparatus is provided. The cup cleaning method includes holding a cup-wash device on a wafer chuck, and dispensing a washing liquid in a catchment groove of the cup-wash device by a nozzle. The cup cleaning method also includes rotating the cup-wash device by the wafer chuck to spray the washing liquid to an inner surface of a cup around the wafer chuck via a number of dispensing openings of the cup-wash device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A cup-wash device, comprising:
   a supporting disk;
   a base, disposed on the supporting disk, comprising a catchment groove, a first dispensing opening formed on an edge of the base, and a first channel connected with the catchment groove and the first dispensing opening; and
   a cover disposed on the base and covering the first channel, wherein the cover has an injection opening connected to the catchment groove;
   wherein the cover comprises a cover body and a side wall disposed on an edge of the cover body and connected to a side surface of the base, wherein the side wall comprises a through hole corresponding to the first dispensing opening.

2. The cup-wash device as claimed in claim 1, wherein the supporting disk is a wafer.

3. The cup-wash device as claimed in claim 1, wherein the first channel is gradually narrowed from the catchment groove to the first dispensing opening.

4. The cup-wash device as claimed in claim 1, wherein the base further comprises a second dispensing opening on the edge of the base, and a second channel connecting the catchment groove with the second dispensing opening.

5. The cup-wash device as claimed in claim 4, wherein a height of the first dispensing opening relative to the supporting disk is higher than a height of the second dispensing opening relative to the supporting disk.

6. The cup-wash device as claimed in claim 4, wherein an inclination of a bottom surface of the first channel relative to the supporting disk is greater than an inclination of a bottom surface of the second channel relative to the supporting disk.

7. The cup-wash device as claimed in claim 4, wherein the catchment groove is located between the first channel and the second channel.

8. A semiconductor apparatus, comprising:
   a cup;
   a wafer chuck located in the cup; and
   a cup-wash device, disposed on the wafer chuck and located in the cup, comprising:
   a supporting disk;
   a base, disposed on the supporting disk, comprising a catchment groove, a plurality of dispensing openings on an edge of the base and facing the cup, and a plurality of channels connected with the catchment groove and the dispensing openings; and
   a cover disposed on the base and covering the channels, wherein the cover has an injection opening connected to the catchment groove.
   wherein the channels are radially arranged about the catchment groove at the base;
   wherein the cover comprises a cover body and a side wall disposed on an edge of the cover body and connected to a side surface of the base, and the side wall comprises a plurality of through holes corresponding to the dispensing openings.

9. The semiconductor apparatus as claimed in claim 8, further comprising a nozzle configured to dispense a washing liquid into the catchment groove, wherein when the cup-wash device is rotated by the wafer chuck, the washing liquid in the catchment groove flows to the dispensing openings via the channels, and disposes to the cup via the dispensing openings.

10. The semiconductor apparatus as claimed in claim 8, wherein the channels are gradually narrowed from the catchment groove to the dispensing openings.

11. The semiconductor apparatus as claimed in claim 8, wherein heights of the dispensing openings relative to the supporting disk are gradually increased.

12. The semiconductor apparatus as claimed in claim 8, wherein inclinations of bottom surfaces of the channels relative to the supporting disk are gradually increased.

13. The semiconductor apparatus as claimed in claim 8, wherein the supporting disk is a wafer.

14. The cup-wash device as claimed in claim 1, wherein the first channel forms a spiral shape.

15. The cup-wash device as claimed in claim 1, wherein the first channel has a uniform width in a direction that is parallel to the supporting disc.

16. The semiconductor apparatus as claimed in claim 8, wherein the channels form a spiral shape.

17. The semiconductor apparatus as claimed in claim 8, wherein each of the channels has a uniform width in a direction that is parallel to the supporting disc.

18. A cup-wash device, comprising:
   a supporting disk;
   a base, disposed on the supporting disk, comprising a catchment groove, a first dispensing opening formed on an edge of the base, and a first channel connected with the catchment groove and the first dispensing opening; and
   a cover disposed on the base and covering the first channel, wherein the cover has an injection opening connected to the catchment groove;
   wherein the cover comprises a cover body and a side wall disposed on an edge of the cover body and connected to a side surface of the base, wherein the side wall comprises a through hole corresponding to the first dispensing opening;
   wherein a thickness of a portion of the cover body that faces the first channel is gradually increased in a direction away from the injection opening.

* * * * *